United States Patent
Miyazaki et al.

(10) Patent No.: US 7,560,977 B2
(45) Date of Patent: Jul. 14, 2009

(54) STEP-UP BOOSTER CIRCUIT

(75) Inventors: Hirokazu Miyazaki, Kanagawa (JP);
Katsuaki Matsui, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 55 days.

(21) Appl. No.: 11/785,308

(22) Filed: Apr. 17, 2007

(65) Prior Publication Data
US 2008/0024199 A1 Jan. 31, 2008

(30) Foreign Application Priority Data
Jul. 28, 2006 (JP) ............... 2006-205678

(51) Int. Cl.
G05F 1/10 (2006.01)
(52) U.S. Cl. .................................... 327/536
(58) Field of Classification Search ................ 327/535, 327/536, 537
See application file for complete search history.

(56) References Cited

U.S. PATENT DOCUMENTS

| | | | | |
|---|---|---|---|---|
| 6,147,547 A | * | 11/2000 | Ogura et al. ............ | 327/536 |
| 6,285,622 B1 | * | 9/2001 | Haraguchi et al. ......... | 365/226 |
| 6,456,541 B2 | * | 9/2002 | Tanzawa ................ | 365/189.11 |
| 6,667,928 B2 | * | 12/2003 | Honma et al. ............ | 365/226 |
| 6,700,434 B2 | * | 3/2004 | Fujii et al. .............. | 327/534 |

FOREIGN PATENT DOCUMENTS

JP 2005-339658 12/2005

* cited by examiner

*Primary Examiner*—Jeffrey S Zweizig
(74) *Attorney, Agent, or Firm*—Volentine & Whitt, P.L.L.C.

(57) ABSTRACT

In a step-up booster circuit, a number of pump circuits are connected in series. Pump control signals are outputted from a pump control circuit, and the pump circuits accordingly generate a required raised voltage by stepping up voltages of signals inputted to the respective pump circuits. The step-up circuit includes an activation control circuit which generates a pump activation signal in accordance with provided signals, which direct operation of the step-up circuit. The pump control circuit controls output of the pump control signals in accordance with a voltage of the pump activation signal.

11 Claims, 7 Drawing Sheets

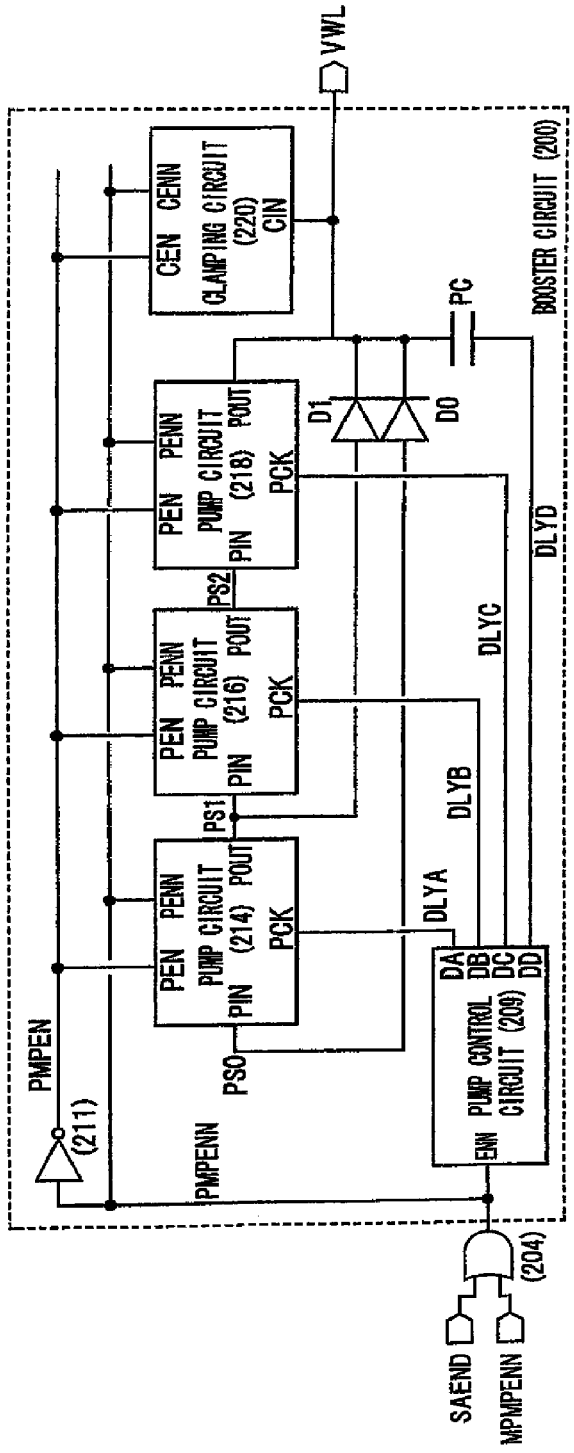
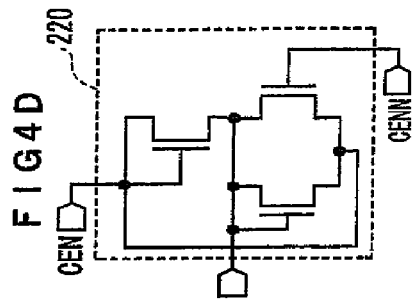
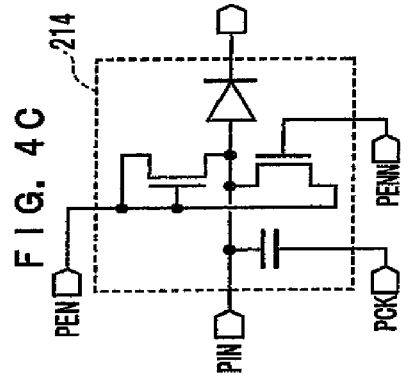
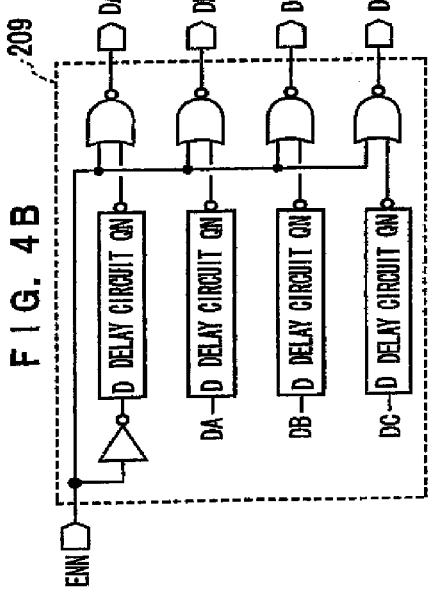
FIG. 4A
FIG. 4B
FIG. 4C
FIG. 4D

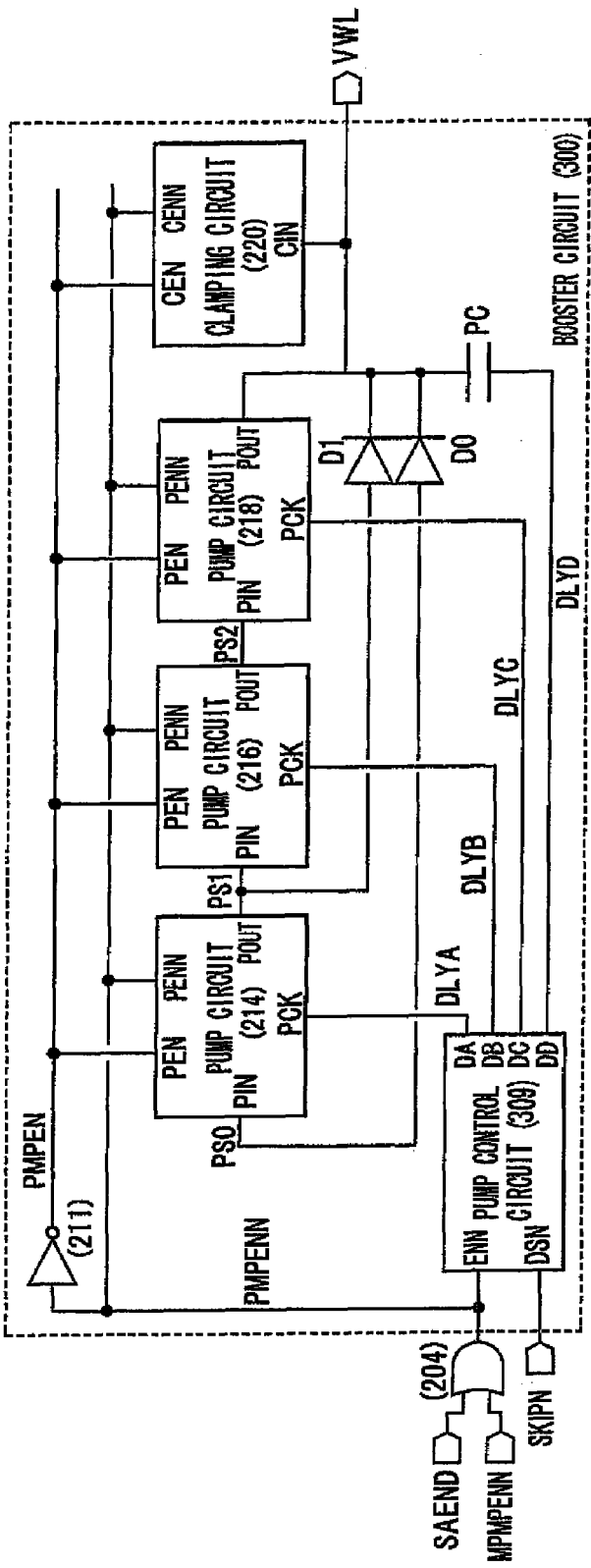
FIG. 6A
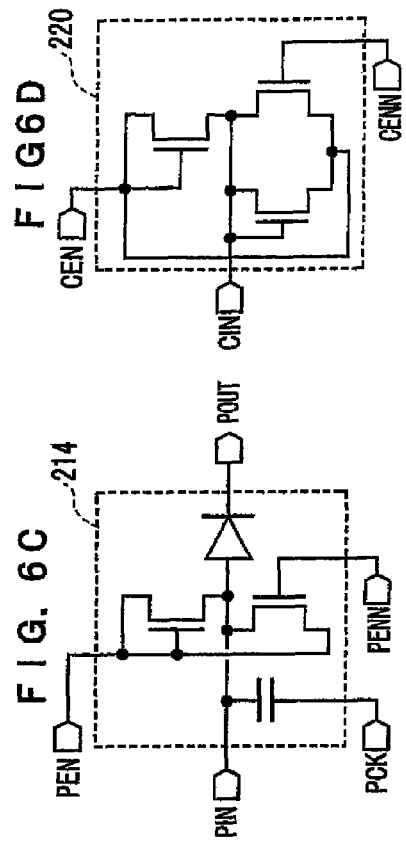
FIG. 6D
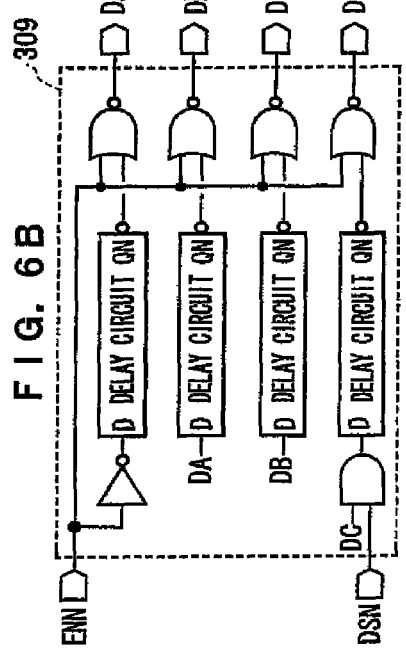
FIG. 6C
FIG. 6B

STEP-UP BOOSTER CIRCUIT

CROSS-REFERENCE TO RELATED APPLICATION

This application claims priority under 35 USC 119 from Japanese Patent Application No. 2006-205678, the disclosure of which is incorporated by reference herein.

BACKGROUND OF THE INVENTION

1. Field of the Invention

The present invention relates to a step-up booster circuit (the circuit is called "a step-up circuit" or "a booster circuit"), and more particularly to a step-up circuit which generates a step-up (boost) voltage to be supplied to a word line of a non-volatile semiconductor storage device.

2. Description of the Related Art

A non-volatile semiconductor storage device which can be electrically written and erased (an EEPROM) uses floating gate-type transistors as memory cells. Accordingly, in order to access a memory cell during reading of data from the memory cells or the like, a high voltage, which is higher than a power supply voltage, must be supplied to a word line connected to the memory cell. Step-up (booster) circuits which serve as circuits for generating these high voltages are available. An example of such step-up circuit is described in Japanese Patent Application Laid-Open (JP-A) No. 2005-339658.

In this reference, a charge-pump circuit is formed with one terminal of each of a plurality of capacitors being connected between respective transistors which structure a charge transfer circuit. A first clock signal generated by a clock generation circuit is supplied to the other terminal of each of the capacitors that are arranged at odd-number positions, and a second clock signal, which is opposite in phase to the first clock signal, is supplied to the other terminal of each of the capacitors that are arranged at even-number positions. As a result, sequential step-ups are implemented and a desired boost voltage is obtained.

In recent years, non-volatile semiconductor storage devices have been utilized in many electronic apparatuses. In a case in which, for example, a non-volatile semiconductor storage device is employed in a portable device which is operated by a battery, a reduction in power consumption of the non-volatile semiconductor storage device is sought. However, conventional step-up circuits, particularly step-up circuits which are employed in non-volatile semiconductor storage devices, have not had sufficient facility for reducing power consumption of the step-up circuits. Moreover, there are variations in thresholds Vtc of memory cells. If a range of such variations is Vtcx≧Vtc≧Vtcn (Vtcx being a maximum value of the memory cell threshold and Vtcn being a minimum value of the memory cell threshold), a word line voltage for times of reading must be set to a potential Vdd+Vtn which is equal to or greater than the maximum value Vtcx of the threshold of the memory cell. However, when memory cell data with the memory cell threshold minimum value Vtcn is being read with the above-mentioned potential Vdd+Vtn, there is an excess potential of Vdd+Vtn−Vtcn. Current consumption of a step-up circuit for producing this excess potential is large, which is a problem.

SUMMARY OF THE INVENTION

The present invention will provide a step-up circuit which realizes a reduction in current consumption.

A first aspect of the present invention is a circuit including: a plurality of pump circuits connected in series; a pump control circuit that outputs a pump control signal, the pump control signal causing, in each of the pump circuits, a voltage of a signal inputted to each of the pump circuits to be stepped up so as to generate a required boost voltage in the step-up circuit; and an activation control circuit that generates a pump activation signal in accordance with a signal that instructs operation of the step-up circuit, wherein the pump control circuit controls output of the pump control signal in accordance with a voltage level of the pump activation signal.

In the step-up circuit, the signal that instructs operation of the step-up circuit includes a pump activation enabling signal, which enables operation of the step-up circuit, and a signal that instructs operation of a sense amplifier, and the activation control circuit controls the generation of the pump activation signal in accordance with a combination of respective voltage levels of the enabling signal and the signal that instructs operation of the sense amplifier.

In the step-up circuit, the pump control circuit outputs, in accordance with the signal that instructs operation of the step-up circuit, a first clock signal, and a second clock signal that is complementary to the first clock signal, as the pump control signal, supplies the first clock signal to, of the plurality of pump circuits, a pump circuit that is arranged at an odd-number position in the connected series and the second clock signal to a pump circuit that is arranged at an even-number position in the connected series.

In the step-up circuit, in accordance with the signal that instructs operation of the step-up circuit, the pump control circuit sequentially delays a transition of voltage level from a first voltage level to a second voltage level and generates a first to an Nth pump control signal as the pump control signal, N being an integer of at least 2, and the plurality of pump circuits includes a series of a first to an Nth pump circuit and, when T is an integer of at least 1 and at most N, a Tth pump control signal is supplied to a Tth pump circuit.

In the step-up circuit, the pump control circuit comprises a stopping control section which, in accordance with a stopping signal, fixes the voltage level of a desired pump control signal of the first to Nth pump control signals at the first voltage level.

According to the step-up circuit of the present aspect, the pump activation signal may be generated in accordance with signals which direct operation of the step-up circuit. Output of pump control signals can be controlled by this pump activation signal, and thus operation of the step-up circuit is controlled and current consumption can be reduced.

Furthermore, the signals which direct operation of the step-up circuit may be an enabling signal which enables operation of the step-up circuit and a signal directing operation of a sense amplifier, and can control operation of the step-up circuit in correspondence with operation of the sense amplifier. Consequently, step-up operations can be performed efficiently and current consumption can be reduced.

Further, the first and second clock signals may be generated at the pump control circuit on the basis of the signal directing operation of the step-up circuit, and the pump circuits can be operated by these two clock signals. Because the necessary clock signals are generated in accordance with times of operation of the step-up circuit, current consumption in a circuit structure for generating the clock signals can be greatly reduced.

Further, the 1st to Nth pump control signals, in which voltage level transitions are sequentially delayed in accordance with the signal directing operations of the step-up circuit, may be generated by the pump control circuit, such that a Tth pump control signal is supplied to a Tth pump circuit. Consequently, step-up operations can be limited in pump circuits that are stepping up, and current consumption during operation of the step-up circuit can be greatly reduced.

Further yet, when the stopping control circuit which fixes the voltage level of a required pump control signal at a first voltage level is provided, operation of some number of the plurality of pump circuits can be suppressed in accordance with a voltage level that is to be stepped up to. Consequently, reading disturbances of memory cells can be suppressed and current consumption of the step-up circuit can be reduced.

BRIEF DESCRIPTION OF THE DRAWINGS

Exemplary embodiments of the present invention will be described in detail based on the following figures, wherein:

FIGS. 4A to 4D are circuit diagrams for describing a step-up circuit of a second exemplary embodiment of the present invention.

FIGS. 6A to 6D are circuit diagrams for describing a step-up circuit of a third exemplary embodiment of the present invention.

DETAILED DESCRIPTION OF THE INVENTION

Herebelow, the step-up circuit of the present invention will be described using the drawings. In exemplary embodiments, step-up circuits which are employed at non-volatile semiconductor storage devices will be described.

First Exemplary Embodiment

Figure 1A:
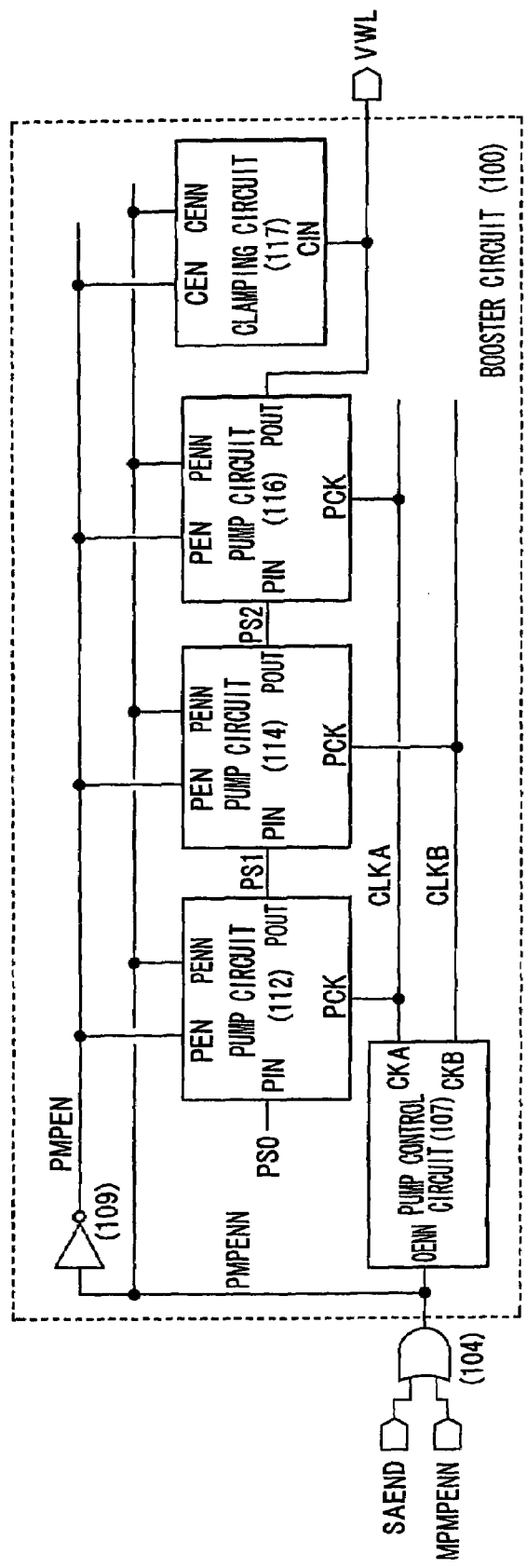
FIGS. 1A to 1D are circuit diagrams for describing a step-up (booster) circuit of a first exemplary embodiment of the present invention.
Figure 1D:
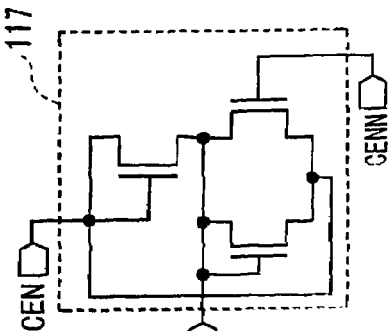
Figure 1C:
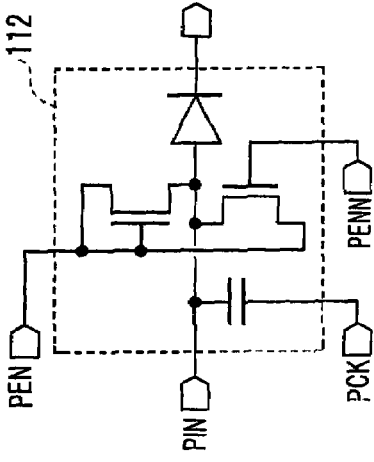
Figure 1B:
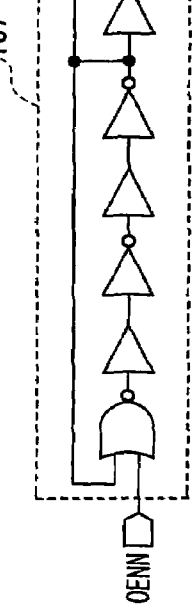

FIGS. 1A to 1D are circuit diagrams of a step-up circuit of a first exemplary embodiment of the present invention. FIG. 1A is an overall diagram of the step-up circuit, FIG. 1B is a circuit diagram of a pump control circuit, FIG. 1C is a circuit diagram of a pump circuit, and FIG. 1D is a circuit diagram of a clamping circuit.

In FIG. 1A, a step-up circuit 100, which generates a raised voltage VWL to be supplied to a word line, includes a two-input OR gate 104, which serves as an activation control circuit. The two-input OR gate 104 inputs a pump activation enabling signal MPMPENN and a sense amplifier-stopping signal SAEND, which is used for controlling operations of a sense amplifier. The sense amplifier is used in reading of data from memory cells and the like. The two-input OR gate 104 outputs an output signal PMPENN, which is a pump activation signal with a voltage level that is logically based on voltage levels of the two input signals. The two signals inputted to the two-input OR gate 104 are, respectively, signals directing operation of the step-up circuit.

The step-up circuit 100 also includes a pump control circuit 107 and an inverter 109. The pump control circuit 107 inputs the output signal PMPENN and, depending on the voltage level of the output signal PMPENN, outputs a signal CLKA and a signal CLKB, which serve as pump control signals. The inverter 109 inputs the signal PMPENN and outputs a signal PMPEN in which the voltage level of the signal PMPENN is inverted. In this exemplary embodiment, the signal CLKA and the signal CLKB are clock signals with complementary voltage levels.

The step-up circuit 100 further includes a pump circuit 112, a pump circuit 114 and a pump circuit 116. The pump circuit 112 respectively inputs the signal PMPENN as a negative activation input, the signal PMPEN as a positive activation input, the clock signal CLKA as a clock input and a signal PS0 as a pump input, and outputs a signal PS1 as a pump output. The pump circuit 114 respectively inputs the signal PMPENN as a negative activation input, the signal PMPEN as a positive activation input, the clock signal CLKB as a clock input and the signal PS1 as a pump input, and outputs a signal PS2 as a pump output. The pump circuit 116 respectively inputs the signal PMPENN as a negative activation input, the signal PMPEN as a positive activation input, the clock signal CLKA as a clock input and the signal PS2 as a pump input, and outputs a raised voltage VWL, to be supplied to a word line for reading, as a pump output. For this exemplary embodiment, a structure in which the three pump circuits are connected in series is utilized as an example.

The step-up circuit 100 further includes a clamping circuit 117, which respectively inputs the signal PMPENN as a negative activation input and the signal PMPEN as a positive activation input, and is connected with an output terminal POUT of the pump circuit 116, which outputs the raised voltage VWL.

As shown in FIG. 1B, the pump control circuit 107 is structured with a two-input NOR gate, which inputs the signal PMPENN and a feedback signal, and pluralities of buffers and inverters. The buffers and inverters are connected alternately in series, with the first buffer inputting the output signal of the two-input NOR gate, a signal which is inputted to the input of the final inverter also being outputted as the signal CLKA, and an output signal from the final inverter being outputted as the signal CLKB. When the signal PMPENN that is inputted is at a power supply voltage (in this exemplary embodiment, a power supply voltage Vdd), the signal CLKA is fixed at a reference voltage (in this exemplary embodiment, a reference voltage Vss) and the signal CLKB is fixed at the power supply voltage Vdd. However, when the signal PMPENN that is inputted is at the reference voltage Vss, the pump control circuit 107 outputs the signals CLKA and CLKB as two complementary clock signals.

As shown in FIG. 1C, the pump circuit 112 is structured with a capacitance element, two N-channel transistors and a diode element. One end of the capacitance element is connected to an input terminal PIN and the other end is connected to a terminal PCK, to which the signal CLKA is provided as a pump input. One N-channel transistor is connected between a positive activation input terminal PEN, to which the signal PMPEN is supplied, and the input terminal PIN, and the gate terminal thereof is connected to the terminal PEN. The other N-channel transistor is connected between the terminal PEN and the input terminal PIN, and the signal PMPENN is provided through a negative activation input terminal PENN to the gate terminal thereof. The diode element is connected between the input terminal PIN and an output terminal POUT. When the step-up circuit 100 is deactivated, the input terminal PIN of the pump circuit 112 is fixed at the reference voltage Vss in accordance with the voltage level of the signal PMPENN. When the step-up circuit 100 is activated, a voltage based on the voltage of the signal PMPEN is provided to the terminal PIN, the voltage of the terminal PIN is raised by charging/discharging of the capacitance element in accordance with clock operations of the signal CLKA, and a stepped-up voltage is outputted as an output through the diode element. Herein, a threshold of the N-channel transistors in the exemplary embodiments is Vtn.

Circuit structures of the pump circuits 114 and 116 are the same as the pump circuit 112, and therefore will not be described. At the pump circuit 116, which is arranged at an odd-number position (the third stage in this exemplary embodiment), the signals which are inputted to the terminals PEN, PENN and PCK are the same as at the pump circuit 112. Therefore, when the step-up circuit 100 is activated and is performing the step-up operation, the pump circuit 116 operates in the same manner as the pump circuit 112. At the pump circuit 114, which is arranged at an even-number position (the second stage in the exemplary embodiment), the signals that are inputted to the terminals PEN and PENN are the same as at the pump circuit 112 but the signal CLKB, which is complementary to the signal CLKA inputted to the terminal PCK of the pump circuit 112, is inputted to the terminal PCK. Therefore, the pump circuit 114 performs the step-up operation with opposite timings from the pump circuit 112.

As shown in FIG. 1D, at the clamping circuit 117, an input terminal CIN is connected with the output terminal POUT of the pump circuit 116. The clamping circuit 117 is structured with three N-channel transistors. One N-channel transistor is connected between a terminal CEN, which is a positive activation terminal, and the input terminal CIN, and the gate terminal thereof is connected to the terminal CEN. Another N-channel transistor is connected between the terminal CEN and the input terminal CIN, and the gate terminal thereof is connected to the input terminal CIN. The third N-channel transistor is connected between the terminal CEN and the input terminal CIN, and the gate terminal thereof is connected to a terminal CENN, which is a negative activation input.

When the step-up circuit is deactivated, the clamping circuit 117 acts such that the input terminal CIN is fixed at the reference voltage Vss in accordance with the voltage level of the signal PMPENN. When the step-up circuit is activated, the clamping circuit 117 acts so as to fix the raised voltage VWL at a boost voltage with a required voltage level.

Figure 2:
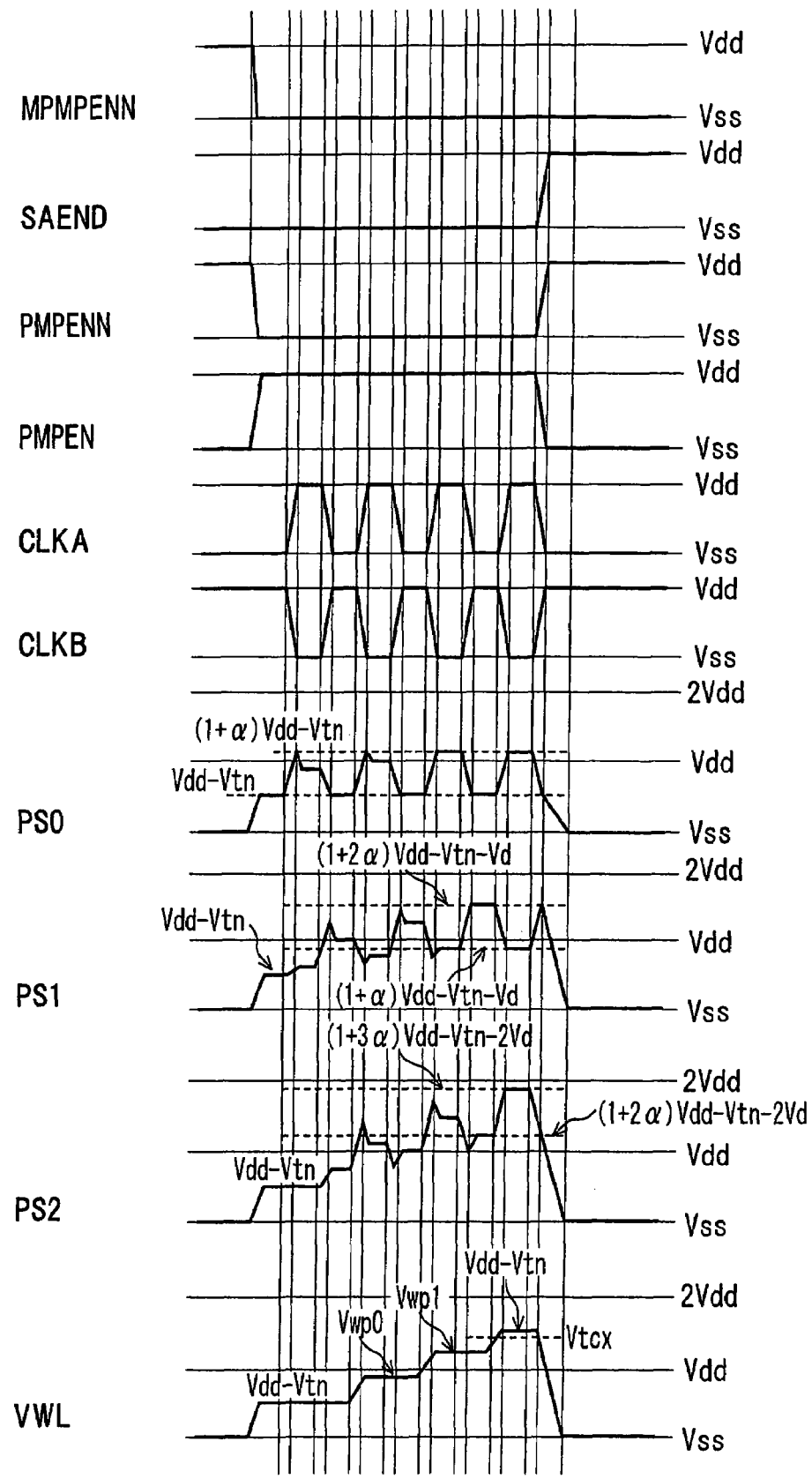
FIG. 2 is a signal waveform chart for describing operation of the step-up circuit of FIG. 1.
Figure 3:
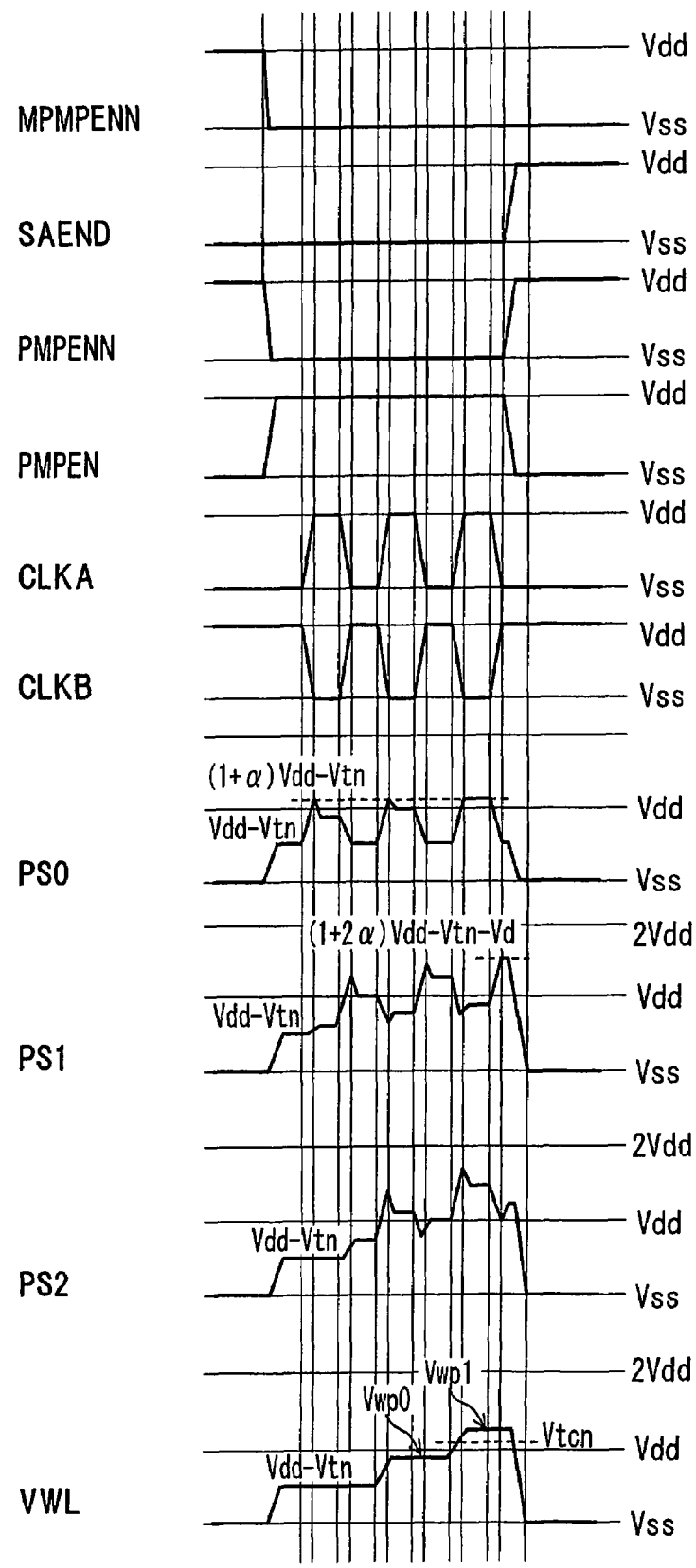
FIG. 3 is a signal waveform chart for describing operation of the step-up circuit of FIG. 1.

Signal waveform charts illustrating operation of the step-up circuit 100 of FIG. 1A are shown in FIGS. 2 and 3. Herebelow, operation of the step-up circuit 100 will be described with reference to these charts.

When the non-volatile semiconductor storage device is in standby, the pump activation enabling signal MPMPENN is at the power supply voltage Vdd, the sense amplifier-stopping signal SAEND is at the reference voltage Vss, and the step-up circuit 100 is in an inactive state.

In the inactive state, the signal PMPENN is at the power supply voltage Vdd, the signal PMPEN is at the reference voltage Vss, and the pump control circuit 107 outputs the reference voltage Vss as the signal CLKA and the power supply voltage Vdd as the signal CLKB. At such a time, the signal PS0 of the pump circuit 112 is fixed at the reference voltage Vss, the signal PS1 of the pump circuit 114 is fixed at the reference voltage Vss, the signal PS2 of the pump circuit 116 is fixed at the reference voltage Vss, and the clamping circuit 117 fixes the voltage VWL to be supplied to a word line for reading at the reference voltage Vss.

When an operation for reading of the non-volatile semiconductor storage device begins, the pump activation enabling signal MPMPENN switches to the reference voltage Vss, and the step-up circuit 100 goes into an active state. With the transition of the pump activation enabling signal MPMPENN, the signal PMPENN goes to the reference voltage Vss and the signal PMPEN goes to the power supply voltage Vdd.

With the transition of the signal PMPENN, the pump control circuit 107 goes into an active state, and outputs a clock signal as the signal CLKA and a clock signal that is opposite in phase to the signal CLKA as the signal CLKB.

With the transitions of the signal PMPENN and the signal PMPEN, the pump circuits 112, 114 and 116 go into active states.

The pump circuits 112, 114 and 116 each raise a potential Vin of the pump input up to a potential Vin+αVdd (α is a boost efficiency) by coupling which occurs in accordance with a transition of the clock input from the reference voltage Vss to the power supply voltage Vdd. The diode element connected between the pump input and the pump output of the pump circuit 112, 114 or 116 is on when a potential difference between the pump input and the pump output is greater than Vd (Vd being a diode threshold), so a diode current flows between the pump input and the pump output. A movement of charge between the capacitance elements connected to the pump input and the pump output (the capacitance element of the pump circuit and the capacitance element of the next pump circuit) is caused by the diode current, so the pump input falls from the potential Vin+αVdd to a potential Vin+αVdd−ΔVm (ΔVm corresponds to a voltage reduction due to the charge movement), and the pump output goes to a potential Vin+αVdd−ΔVm−Vd (Vd being the diode threshold).

As time passes in the step-up operation of the pump circuits 112, 114 and 116, the charge movement amounts between the pump inputs and the pump outputs get smaller, and ΔVm corresponding to the reductions of voltage due to the charge movements becomes smaller. Thus, the potentials of the pump inputs and the pump outputs rise in steps. In a stable state, in which there are no more charge movements between the pump inputs and the pump outputs, the pump inputs are stable at potentials Vin+αVdd, and the pump outputs are stable at potentials Vin+αVdd−Vd.

The signal PS0 rises in steps from the initial potential Vdd−Vtn, due to the step-up operation of the pump circuit 112, and stabilizes at a potential (1+α)Vdd−Vtn.

The signal PS1 rises in steps from the initial potential Vdd−Vtn, due to charge supplies from the pump circuit 112 and the step-up operation of the pump circuit 114, and stabilizes at a potential (1+2α)Vdd−Vtn−Vd.

The signal PS2 rises in steps from the initial potential Vdd−Vtn, due to charge supplied from the pump circuit 114 and the step-up operation of the pump circuit 116, and stabilizes at a potential (1+3α)Vdd−Vtn−2Vd.

The voltage VWL to be supplied to a word line for reading is raised in steps from the initial potential Vdd−Vtn, due to charge supplied from the pump circuit 116, and is fixed at the potential Vdd+Vtn by the clamping circuit 117.

Now, FIG. 2 is a waveform chart for when reading memory cell data with a memory cell threshold being at a maximum value Vtcx. The maximum value Vtcx of the memory cell threshold is greater than a potential Vwp1 of a raising step of the voltage VWL. At a time at which the voltage VWL rises above the potential Vwp1, reading of the memory cell data begins. At a time at which reading of the memory cell data has finished, the sense amplifier-stopping signal SAEND switches to the power supply voltage Vdd.

With the switching of the sense amplifier-stopping signal SAEND, the signal PMPENN goes to the power supply voltage Vdd and the signal PMPEN goes to the reference voltage Vss, and the step-up circuit 100 returns to the inactive state.

FIG. 3 is a waveform chart for when reading memory cell data with the memory cell threshold being at a minimum value Vtcn. The minimum value Vtcn of the memory cell threshold is greater than a potential Vwp0 of a raising step of the voltage VWL. At a time at which the voltage VWL has risen above the potential Vwp0, reading of the memory cell data begins. At a time at which reading of the memory cell data has finished, the sense amplifier-stopping signal SAEND switches to the power supply voltage Vdd.

With the switching of the sense amplifier-stopping signal SAEND, the signal PMPENN goes to the power supply voltage Vdd and the signal PMPEN goes to the reference voltage Vss, and the step-up circuit 100 returns to the inactive state prior to the operation for raising the voltage VWL from the Vwp1 toward the potential Vdd+Vtn.

According to the step-up circuit of the first exemplary embodiment as described above, the voltage VWL to be supplied to a word line for reading is raised in steps, a voltage VWL that is suitable for a memory cell threshold is generated and, in accordance with reading of data from the memory cell being completed, the sense amplifier-stopping signal SAEND causes the step-up operation of the step-up circuit 100 to stop. Thus, a reduction of current consumption of the step-up circuit 100 is enabled.

Second Exemplary Embodiment

FIGS. 4A to 4D are circuit diagrams of a step-up circuit of a second exemplary embodiment of the present invention. FIG. 4A is an overall diagram of the step-up circuit, FIG. 4B is a circuit diagram of a pump control circuit, FIG. 4C is a circuit diagram of a pump circuit, and FIG. 4D is a circuit diagram of a clamping circuit.

A step-up circuit 200 of the second exemplary embodiment includes a two-input OR gate 204, which serves as an activation control circuit. The two-input OR gate 204 inputs the pump activation enabling signal MPMPENN and the sense amplifier-stopping signal SAEND, which is used for controlling operations of a sense amplifier. The sense amplifier is used in reading of data from memory cells and the like. The two-input OR gate 204 outputs the output signal PMPENN, which is a pump activation signal with a voltage level that is logically based on voltage levels of the two input signals. The two signals inputted to the two-input OR gate 204 are, respectively, signals directing operation of the step-up circuit.

The step-up circuit 200 also includes a pump control circuit 209 and an inverter 211. The pump control circuit 209 inputs the output signal PMPENN and, depending on the voltage level of the output signal PMPENN, outputs signals DLYA, DLYB, DLYC and DLYD, which serve as pump control signals. The inverter 211 inputs the signal PMPENN, and outputs the signal PMPEN in which the voltage level of the signal PMPENN is inverted.

The step-up circuit 200 further includes a pump circuit 214, a pump circuit 216 and a pump circuit 218. The pump circuit 214 respectively inputs the signal PMPENN as a negative activation input, the signal PMPEN as a positive activation input, the signal DLYA as a clock input and a signal PS0 as a pump input, and outputs a signal PS1 as a pump output. The pump circuit 216 respectively inputs the signal PMPENN as a negative activation input, the signal PMPEN as a positive activation input, the signal DLYB as a clock input and the signal PS1 as a pump input, and outputs a signal PS2 as a pump output. The pump circuit 218 respectively inputs the signal PMPENN as a negative activation input, the signal PMPEN as a positive activation input, the signal DLYC as a clock input and the signal PS2 as a pump input, and outputs a raised voltage VWL, to be supplied to a word line for reading, as a pump output. For this exemplary embodiment, a structure in which the three pump circuits are serially connected is utilized as an example.

The step-up circuit 200 further includes a capacitance element PC, a diode element D0 and a diode element D1. The capacitance element PC is connected between a terminal DD of the pump control circuit 209, which outputs the signal DLYD, and the terminal that outputs the voltage VWL. At the diode D0, the signal PS0 is provided to the positive terminal and the negative terminal is connected with the terminal that outputs the voltage VWL. At the diode D1, the signal PS1 is provided to the positive terminal and the negative terminal is connected with the terminal that outputs the voltage VWL.

The step-up circuit 200 still further includes a clamping circuit 220, which respectively inputs the signal PMPENN as a negative activation input and the signal PMPEN as a positive activation input, and is connected with an output terminal POUT of the pump circuit 218, which is the terminal that outputs the raised voltage VWL.

As shown in FIGS. 4C and 4D, circuit structures of the pump circuits 214, 216 and 218 are similar to the pump circuits of the first exemplary embodiment, and the circuit structure of the clamping circuit 220 is similar to the clamping circuit of the first exemplary embodiment.

As shown in FIG. 4B, the pump control circuit 209 includes an inverter, first to fourth delay circuits and first to fourth NOR gates. The input of the inverter is connected to a terminal ENN, at which the signal PMPENN is inputted. The first delay circuit inputs an output signal from the inverter, and delays and outputs a signal whose voltage level is inverted from the output signal of the inverter. The first NOR gate inputs the output signal from the first delay circuit and the signal from the terminal ENN, and outputs the signal DLYA. The second delay circuit inputs the signal DLYA, and delays and outputs a signal whose level is inverted from the signal DLYA. The second NOR gate inputs the output signal from the second delay circuit and the signal from the terminal ENN, and outputs the signal DLYB. The third delay circuit inputs the signal DLYB, and delays and outputs a signal whose level is inverted from the signal DLYB. The third NOR gate inputs the output signal from the third delay circuit and the signal from the terminal ENN, and outputs the signal DLYC. The fourth delay circuit inputs the signal DLYC, and delays and outputs a signal whose level is inverted from the signal DLYC. The fourth NOR gate inputs the output signal from the fourth delay circuit and the signal from the terminal ENN, and outputs the signal DLYD. When the inputted signal PMPENN is at the power supply voltage Vdd, the pump control circuit 209 fixes the signals DLYA, DLYB, DLYC and DLYD at the reference voltage Vss. However, when the inputted signal PMPENN is at the reference voltage Vss, the pump control circuit 209 outputs the signals DLYA, DLYB, DLYC and DLYD with timings at which these switch from the reference voltage Vss to the power supply voltage Vdd being sequentially delayed.

Figure 5:
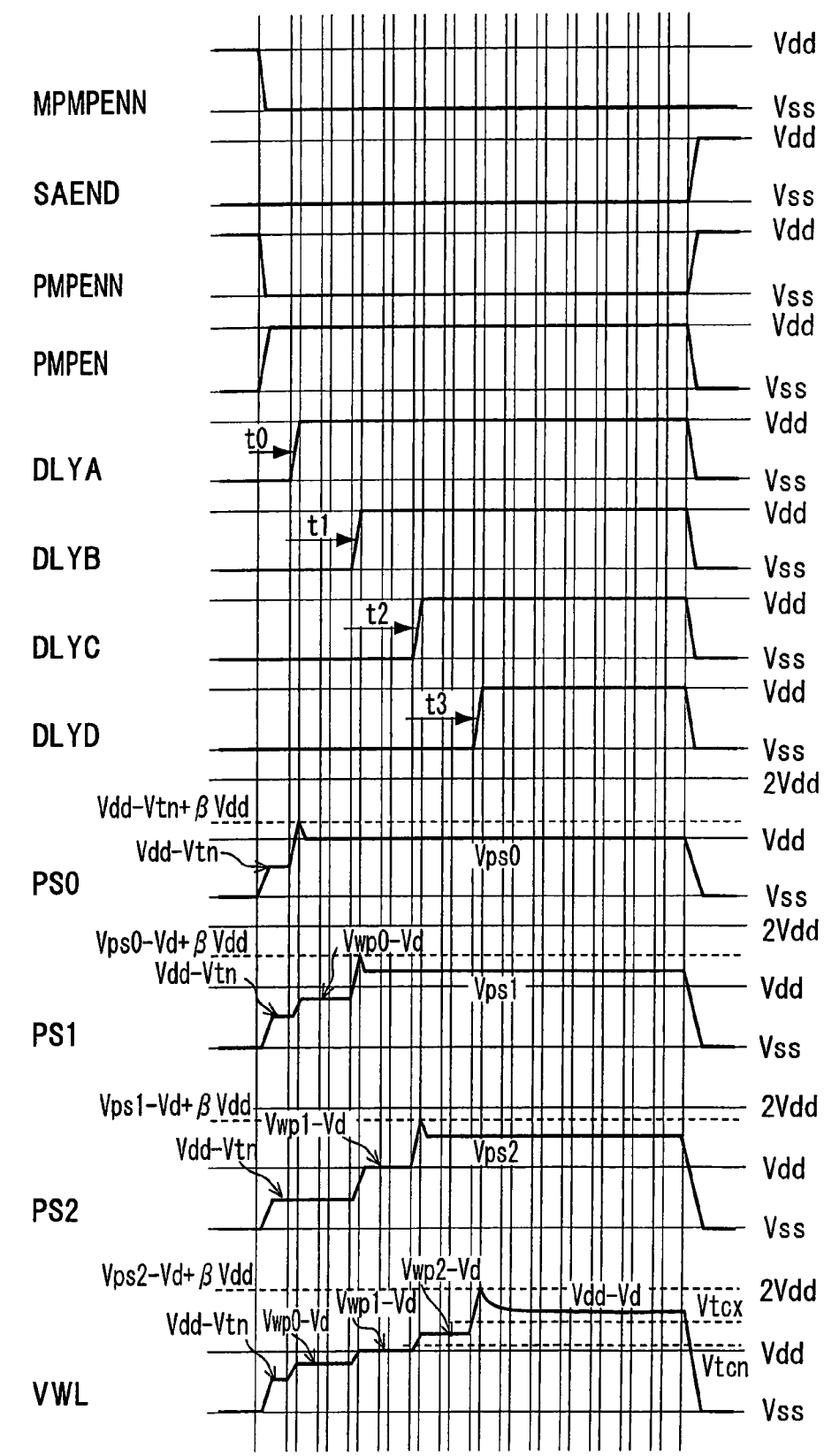
FIG. 5 is a signal waveform chart for describing operation of the step-up circuit of FIG. 4.

FIG. 5 is a signal waveform chart illustrating operation of the step-up circuit 200 of the second exemplary embodiment. Herebelow, operation of the step-up circuit 200 of the second exemplary embodiment will be described with reference to FIG. 5. When the non-volatile semiconductor storage device is in standby, the pump activation enabling signal MPMPENN is at the power supply voltage Vdd, the sense amplifier-stopping signal SAEND is at the reference voltage Vss, and the step-up circuit 200 is in an inactive state.

In the inactive state, the signal PMPENN is at the power supply voltage Vdd and the signal PMPEN is at the reference voltage Vss.

The pump control circuit 209 outputs the reference voltage Vss as the signal DLYA, the reference voltage Vss as the signal DLYB, the reference voltage Vss as the signal DLYC, and the reference voltage Vss as the signal DLYD.

The signal PS0 of the pump circuit 214 is fixed at the reference voltage Vss, the signal PS1 of the pump circuit 216 is fixed at the reference voltage Vss, the signal PS2 of the pump circuit 218 is fixed at the reference voltage Vss, and the clamping circuit 220 fixes the voltage VWL at the reference voltage Vss.

When an operation for reading of the non-volatile semiconductor storage device begins, the pump activation enabling signal MPMPENN switches from the power supply voltage Vdd to the reference voltage Vss, and the step-up circuit 200 goes into an active state. With the transition of the pump activation enabling signal MPMPENN, the signal PMPENN goes to the reference voltage Vss and the signal PMPEN goes to the power supply voltage Vdd.

When the signal PMPENN switches to the reference voltage Vss, the pump circuit 214 is in an initial state and the signal PS0 is charged up to a potential Vdd−Vtn, the pump circuit 216 is in an initial state and the signal PS1 is charged up to the potential Vdd−Vtn, the pump circuit 218 is in an initial state and the signal PS2 is charged up to the potential Vdd−Vtn, and the clamping circuit 220 is in an initial state and the voltage VWL is charged up to the potential Vdd−Vtn.

After a duration t0 has passed since the transition of the signal PMPENN to the reference voltage Vss, the pump control circuit 209 switches the voltage of the signal DLYA from the reference voltage Vss to the power supply voltage Vdd.

The pump circuit 214 raises the signal PS0 from the potential Vdd−Vtn to a potential Vdd−Vtn+βVdd (β is a boost efficiency) by coupling which occurs in accordance with the transition of the signal DLYA from the reference voltage Vss to the power supply voltage Vdd. The diode element of the pump circuit 214, which is connected between an input terminal PIN at which the signal PS0 is inputted and an output terminal POUT at which the signal PS1 is outputted, is on when a potential difference between the signal PS0 and the signal PS1 is greater than Vd, so a diode current flows between the signal PS0 and the signal PS1. The diode element D0, which is connected between the input terminal PIN at which the signal PS0 is inputted and the terminal at which the voltage VWL is outputted, is on when a potential difference between the signal PS0 and the voltage VWL is greater than Vd, so a diode current flows between the signal PS0 and the voltage VWL. Movements of charge from the capacitance element connected to the input terminal PIN that inputs the signal PS0 to the capacitance elements connected to the terminals that output the signal PS1 and the voltage VWL (the capacitance element of the pump circuit 216 and the capacitance element PC) are caused by the diode currents through the diode element of the pump circuit 214 and the diode element D0. As a result, the signal PS0 falls from the potential Vdd−Vtn+βVdd to a potential Vdd−Vtn+βVdd−ΔVm (ΔVm corresponds to a voltage reduction due to the charge movements), and the signal PS1 and the voltage VWL go to potentials Vwp0−Vd (in which Vwp0=Vdd−Vtn+βVdd−ΔVm).

After a duration t1 has passed since the transition of the signal DLYA to the power supply voltage Vdd, the pump control circuit 209 switches the voltage of the signal DLYB from the reference voltage Vss to the power supply voltage Vdd.

The pump circuit 216 raises the signal PS1 from the potential Vwp0−Vd to a potential Vwp0−Vd+βVdd by coupling which occurs in accordance with the transition of the signal DLYB from the reference voltage Vss to the power supply voltage Vdd. The diode element of the pump circuit 216, which is connected between an input terminal PIN at which the signal PS1 is inputted and an output terminal POUT at which the signal PS2 is outputted, is on when a potential difference between the signal PS1 and the signal PS2 is greater than Vd, so a diode current flows between the signal PS1 and the signal PS2. The diode element D1, which is connected between the input terminal PIN at which the signal PS1 is inputted and the terminal at which the voltage VWL is outputted, is on when a potential difference between the signal PS1 and the voltage VWL is greater than Vd, so a diode current flows between the signal PS1 and the voltage VWL. Movements of charge from the capacitance element connected to the input terminal PIN that inputs the signal PS1 to the capacitance elements connected to the terminals that output the signal PS2 and the voltage VWL (the capacitance element of the pump circuit 218 and the capacitance element PC) are caused by the diode currents through the diode element of the pump circuit 216 and the diode element D1. Thus, the signal PS1 falls from the potential Vwp0−Vd+βVdd to a potential Vwp0−Vd+βVdd−ΔVm, and the signal PS2 and the voltage VWL go to potentials Vwp1−Vd (in which Vwp1=Vwp0−Vd+βVdd−ΔVm).

After a duration t2 has passed since the transition of the signal DLYB to the power supply voltage Vdd, the pump control circuit 209 switches the voltage of the signal DLYC from the reference voltage Vss to the power supply voltage Vdd.

The pump circuit 218 raises the signal PS2 from the potential Vwp1−Vd to a potential Vwp1−Vd+βVdd by coupling which occurs in accordance with the transition of the signal DLYC from the reference voltage Vss to the power supply voltage Vdd. The diode element of the pump circuit 218, which is connected between an input terminal PIN at which the signal PS2 is inputted and the terminal at which the voltage VWL is outputted, is on when a potential difference between the signal PS2 and the voltage VWL is greater than Vd, so a diode current flows between the signal PS2 and the voltage VWL. A movement of charge from the capacitance element connected to the signal PS2 to the capacitance element PC connected to the voltage VWL is caused by the diode current through the diode element of the pump circuit 218. Thus, the signal PS2 falls from the potential Vwp1−Vd+βVdd to a potential Vwp1−Vd+βVdd−ΔVm, and the voltage VWL goes to a potential Vwp2−Vd (in which Vwp2=Vwp1−Vd+βVdd−ΔVm).

After a duration t3 has passed since the transition of the signal DLYC to the power supply voltage Vdd, the pump control circuit 209 switches the voltage of the signal DLYD from the reference voltage Vss to the power supply voltage Vdd.

The capacitance element PC connected to the signal DLYD raises the voltage VWL from the potential Vwp2−Vd up to a potential Vwp2−Vd+βVdd by coupling which occurs in accordance with the transition of the signal DLYD from the reference voltage Vss to the power supply voltage Vdd, and the clamping circuit 220 fixes the voltage VWL at the potential Vdd+Vtn.

Thus, the voltage VWL rises from the initial potential Vdd−Vtn to the potential Vwp0−Vd due to the supply of charge from the pump circuit 214, rises from the potential Vwp0−Vd to the potential Vwp1−Vd due to the supply of charge from the pump circuit 216, and rises from the potential Vwp1−Vd to the potential Vwp2−Vd due to the supply of charge from the pump circuit 218. In this manner, the voltage VWL rises in steps and, as a result, the voltage is ultimately fixed at the potential Vdd+Vtn by the clamping circuit 220.

Reading of memory cell data is performed using this raised voltage VWL, in a similar manner to the first exemplary embodiment, and at a time at which the reading of the memory cell data has finished, the sense amplifier-stopping signal SAEND switches to the power supply voltage Vdd.

With the switching of the sense amplifier-stopping signal SAEND, the signal PMPENN goes to the power supply voltage Vdd and the signal PMPEN goes to the reference voltage Vss, and the step-up circuit 200 returns to the inactive state.

With the step-up circuit of the second exemplary embodiment illustrated above, similarly to the first exemplary embodiment, raising of the voltage VWL in steps is enabled. A voltage VWL that is appropriate for a memory cell threshold can be selected with the sense amplifier-stopping signal SAEND and the step-up operation of the step-up circuit 200 can be stopped, and thus a reduction of current consumption of the step-up circuit 200 is enabled. Moreover, in the second exemplary embodiment, the signals DLYA to DLYD, which serve as pump activation signals, are sequentially outputted from the pump control circuit 209 with different switching timings, and the respective pump circuits operate in accordance with these signals. Therefore, a number of switches in voltage of the pump activation signals is suppressed and pump operations in each pump circuit are reduced in number, and current consumption can be further reduced.

Third Exemplary Embodiment

FIGS. 6A to 6D are circuit diagrams of a step-up circuit of a third exemplary embodiment of the present invention. FIG. 6A is an overall diagram of the step-up circuit, FIG. 6B is a circuit diagram of a pump control circuit, FIG. 6C is a circuit diagram of a pump circuit, and FIG. 6D is a circuit diagram of a clamping circuit. In the third exemplary embodiment, structure of the step-up circuit of FIG. 6A is the same as the step-up circuit of FIG. 4A, structure of the pump circuit of FIG. 6C is the same as the pump circuit of FIG. 4C, and structure of the clamping circuit of FIG. 6D is the same as the clamping circuit of FIG. 4D.

In a pump control circuit 309 of the third exemplary embodiment, as shown in FIG. 6B, an AND gate, which serves as a stopping control circuit, is added to the pump control circuit 209 of the second exemplary embodiment. The inputs of the AND gate are a stopping signal SKIPN and the signal DLYC, and the output is connected to the input of the fourth delay circuit. Structure of the pump control circuit 309 is otherwise the same as the pump control circuit of the second exemplary embodiment.

Figure 7:
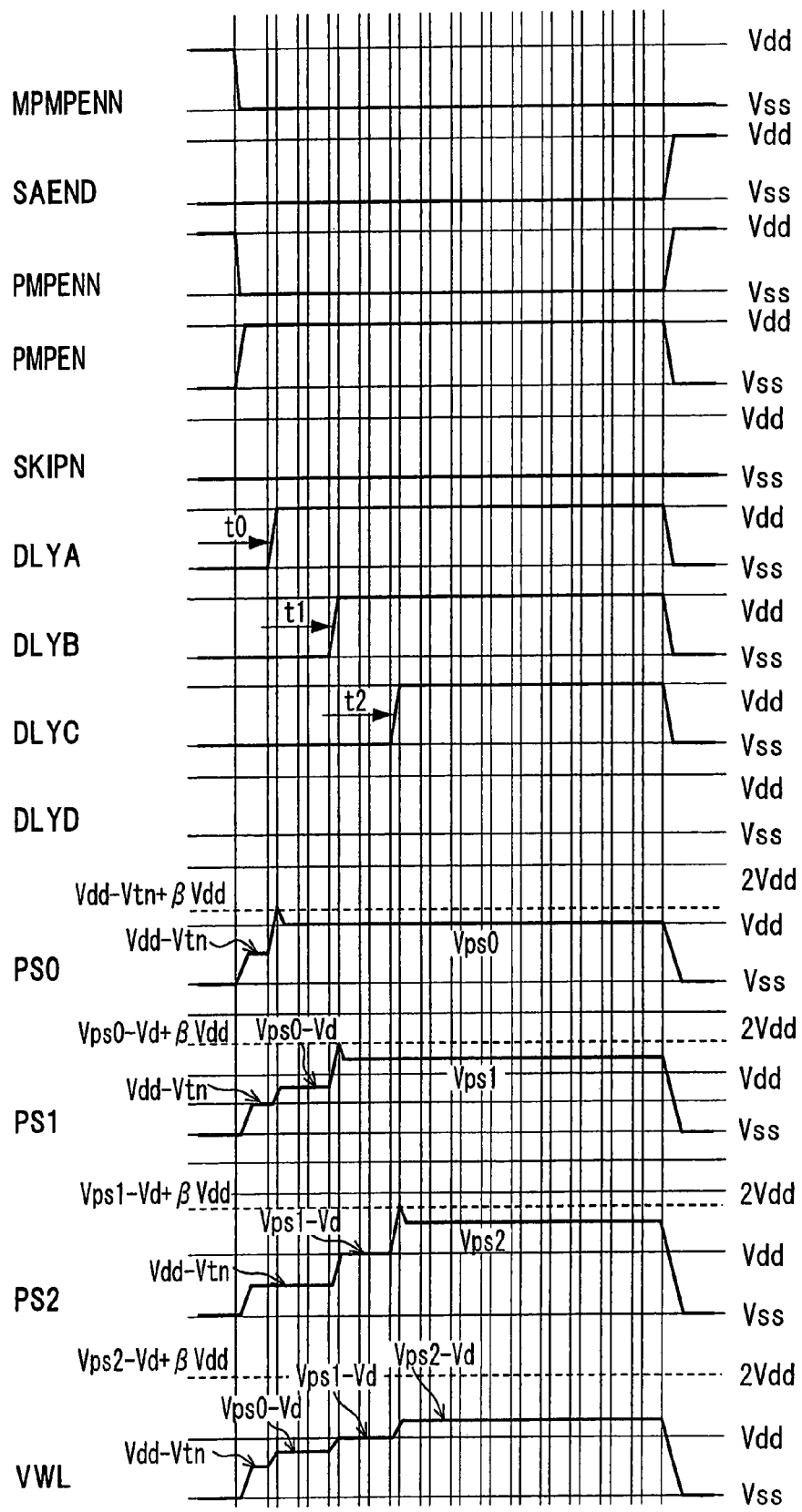
FIG. 7 is a signal waveform chart for describing operation of the step-up circuit of FIG. 6.

FIG. 7 is a signal waveform chart describing operation of a step-up circuit 300 of the third exemplary embodiment. Operation of the step-up circuit 300 will be described with reference to FIG. 7.

When the pump activation enabling signal MPMPENN is at the power supply voltage Vdd, the step-up circuit 300 is in the inactive state. Because the same operations are performed as in the inactive state illustrated for the second exemplary embodiment, descriptions thereof will not be given here.

If the stopping signal SKIPN is at the power supply voltage Vdd, an activation operation of the step-up circuit 300 implements operations the same as the activation operation of the second exemplary embodiment, and therefore descriptions thereof will not be given here.

If the stopping signal SKIPN is at the reference voltage Vss, the pump control circuit 309 fixes the signal DLYD, which is an output thereof, at the reference voltage Vss. Thus, differently from the case of the second exemplary embodiment, an activation operation of the step-up circuit 300 at such a time does not implement raising of the voltage VWL with the capacitance element PC, and the voltage VWL ends the step-up operation at the potential Vwp2−Vd.

The step-up circuit of the third exemplary embodiment is particularly effective when there is a necessity for operations to be performed using a power supply voltage Vdd which is higher than a power supply voltage anticipated at the time of design. That is, in the step-up circuit, transition timings of the signals DLYA to DLYD, which are delayed to be employed for step-ups, and a transition timing of the sense amplifier-stopping signal SAEND are adjusted in consideration of a power supply voltage Vdd that is to be applied, and the voltage level of a voltage VWL that is to be generated is set. Accordingly, with a step-up circuit in which the transition timings of the signals DLYA to DLYD and the sense amplifier-stopping signal SAEND have been adjusted for, for example, a low power supply voltage (for example, 1.8 V), the transition timings of the signals DLYA to DLYD and the sense amplifier-stopping signal SAEND are not necessarily limited to being the same if a higher power supply voltage is employed (for example, 3.3 V, a voltage which is higher than 1.8 V) as when the power supply voltage is low. Specifically, in a case in which a higher power supply voltage is used, the voltage VWL whose voltage level has been raised in accordance with the signal DLYC switching from the reference voltage Vss to the power supply voltage Vdd reaches an optimum voltage level for reading, and reading with this voltage VWL is properly carried out, but if the switching of the sense amplifier-stopping signal SAEND were to be delayed to after the switching of the next signal DLYD, the next step-up operation would be commenced. In the step-up circuit of the third exemplary embodiment, the stopping signal SKIPN can be generated separately from the sense amplifier-stopping signal SAEND in accordance with the completion of reading, and even when it is necessary to employ a higher power supply voltage, unnecessary step-up operations can be reliably suppressed as described above.

Thus, in the third exemplary embodiment, the step-up operation of the capacitance element PC by the signal DLYD is prevented by the stopping signal SKIPN switching to the reference signal Vss, and the voltage VWL can be caused to decrease from the potential Vdd+Vtn to the potential Vwp2−Vd. Therefore, when carrying out an operation for reading of a non-volatile semiconductor storage device using a higher power supply voltage (for example, 3.3 V) as the power supply voltage Vdd, cases of the voltage VWL that is generated by the step-up circuit rising more than necessary, and effects thereof on memory cell data preservation characteristics due to reading disturbance of the memory cells by the voltage VWL, can be suppressed. Thus, it is possible to form the step-up circuit of the third exemplary embodiment and suppress unnecessary step-up operations, by the stopping signal SKIPN being set to the reference voltage Vss or the power supply voltage Vdd depending on the power supply voltage Vdd, and reading disturbance of the memory cells by the voltage VWL can be suppressed.

Variant Examples

The step-up circuit of the present invention has been described by the above descriptions, but the step-up circuit is not limited to the structures of the exemplary embodiments described hereabove.

For example, the structures of capacitance elements and diode elements of the respective exemplary embodiments are applicable provided operations of the present invention can be realized, but are not limiting to the present invention.

Numbers of the pump circuits illustrated in the exemplary embodiments are not limited to the numbers described for these exemplary embodiments; and a number of signals which are outputs from the pump control circuit illustrated in the first exemplary embodiment, a number of signals which are outputs from the pump control circuit illustrated in the second exemplary embodiment, and suchlike are not limited by the exemplary embodiments.

Furthermore, a stopping signal generating means illustrated in the third exemplary embodiment could, in a case in which it is known beforehand that the power supply voltage Vdd to be employed is large, supply a voltage fixed in accordance therewith. In a case in which it is not known beforehand whether the power supply voltage Vdd to be employed will be large, the size of a power supply voltage Vdd that is supplied to a device at which the step-up circuit is installed may be sensed and the stopping signal generated with a voltage which depends on a result of this sensing.

Further, in the third exemplary embodiment, a single stopping signal is provided for stopping a step-up operation at a single stage, but a plurality of stopping signals for stopping step-up operations could be provided, so as to stop step-up operations at a plurality of stages, or step-up operations of a plurality of stages could be stopped with a single stopping signal.

Further yet, there is no impediment to employment of the step-up circuit of the present invention in circuits at which a step-up circuit is to be installed, but as mentioned above, the step-up circuit of the present invention is particularly excellent for use in raising voltages of word lines at times of reading of non-volatile semiconductor storage devices.

What is claimed is:

1. A step-up booster circuit comprising:
a plurality of pump circuits connected in series;
a pump control circuit that outputs a pump control signal, the pump control signal causing, in each of the pump circuits, a voltage of a signal inputted to each of the pump circuits to be stepped up so as to generate a required boost voltage in the step-up booster circuit; and
an activation control circuit that generates a pump activation signal in accordance with a signal that instructs operation of the step-up booster circuit,
wherein the pump control circuit controls output of the pump control signal in accordance with a voltage level of the pump activation signal, and
wherein each of the pump circuits operates such that when the pump activation signal is at a first logical level outputs of the pump circuits are fixed to a predetermined low voltage level which is lower than the boost voltage, and when the pump activation signal is at a second logical level voltage signals input to the pump circuits are stepped-up in accordance with the pump control signal and the stepped-up voltage signals are output from the pump circuits.

2. The step-up booster circuit of claim 1, wherein
the signal that instructs operation of the step-up booster circuit includes a pump activation enabling signal, which enables operation of the step-up booster circuit, and a signal that instructs operation of a sense amplifier, and
the activation control circuit controls the generation of the pump activation signal in accordance with a combination of respective voltage levels of the pump activation enabling signal and the signal that instructs operation of the sense amplifier.

3. The step-up booster circuit of claim 1 wherein, the pump control circuit outputs, in accordance with the signal that instructs operation of the step-up booster circuit, a first clock signal, and a second clock signal that is complementary to the first clock signal, as the pump control signal, supplies the first clock signal to pump circuits of the plurality of pump circuits that are arranged at odd-number positions in the connected series and supplies the second clock signal to pump circuits of the plurality of pump circuits that are arranged at even-number positions in the connected series.

4. The step-up booster circuit of claim 1 wherein, in accordance with the signal that instructs operation of the step-up circuit, the pump control circuit sequentially delays a transition of voltage level from a first voltage level to a second voltage level and generates first to Nth pump control signals as the pump control signal, N being an integer of at least 2, and
the plurality of pump circuits include a series of first to Nth pump circuits and, when T is an integer of at least 1 and at most N, a Tth pump control signal is supplied to a Tth pump circuit.

5. The step-up booster circuit of claim 4, wherein the pump control circuit comprises a stopping control section which, in accordance with a stopping signal, fixes the voltage level of a desired pump control signal of the first to Nth pump control signals at the first voltage level.

6. The step-up booster circuit of claim 1, further comprising a clamping circuit that clamps the output of a pump circuit at a last stage of the plurality of pump circuits to a predetermined voltage level.

7. The step-up booster circuit of claim 6, wherein the clamping circuit operates such that when the pump activation signal is at the first logical level, the pump activation signal fixes the output of the pump circuit at the last stage of the plurality of pump circuits at the predetermined low voltage level which is lower than the boost voltage, and when the pump activation signal is at the second logical level, prevents the output of the pump circuit at the last stage of the plurality of pumps from exceeding the boost voltage.

8. The step-up booster circuit of claim 2, further comprising a clamping circuit that clamps the output of a pump circuit at a last stage of the plurality of pump circuits to a predetermined voltage level.

9. The step-up booster circuit of claim 8, wherein the clamping circuit operates such that when the pump activation signal is at the first logical level, the pump activation signal fixes the output of the pump circuit at the last stage of the plurality of pump circuits at the predetermined low voltage level which is lower than the boost voltage, and when the pump activation signal is at the second logical level, prevents the output of the pump circuit at the last stage of the plurality of pumps from exceeding the boost voltage.

10. The step-up booster circuit of claim 3, further comprising a clamping circuit that clamps the output of a pump circuit at a last stage of the plurality of pump circuits to a predetermined voltage level.

11. The step-up booster circuit of claim 10, wherein the clamping circuit operates such that when the pump activation signal is at the first logical level, the pump activation signal fixes the output of the pump circuit at the last stage of the plurality of pump circuits at the predetermined low voltage level which is lower than the boost voltage, and when the pump activation signal is at the second logical level, prevents the output of the pump circuit at the last stage of the plurality of pumps from exceeding the boost voltage.

* * * * *